March 31, 1970 M. HETZEL 3,504,301

MECHANICAL OSCILLATOR

Filed Jan. 30, 1968 4 Sheets-Sheet 4

United States Patent Office 3,504,301

Patented Mar. 31, 1970

3,504,301

MECHANICAL OSCILLATOR

Max Hetzel, Bienne, Switzerland, assignor to Centre Electronique Horloger S.A., Neuchatel, Switzerland, a Swiss company Filed Jan. 30, 1968, Ser. No. 701,724

Claims priority, application Switzerland, Jan. 31, 1967, 1,424/67

Int. Cl. H03b 5/30

U.S. Cl. 331—116 6 Claims

ABSTRACT OF THE DISCLOSURE

An electromechanical oscillator comprises a mechanical resonator controlled by a driving coil, a compensating impedence connected in series with the driving coil by a voltage source, two capacitances connected in series, means connecting the driving coil and the compensating impedance and the two capacitances to form a bridge circuit, an amplifier having output means to bridge the interconnection between the driving coil and one of the capacitances, the output means further including means to bridge the interconnection between the compensating impedance and the other of the two capacitances, means connecting the other interconnections of the bridge to an input terminal of the amplifier whereby the compensating impedance forms a negative feedback loop between the input terminal and the output means of the amplifier in order to compensate for voltage induced by driving currents of the driving coil.

The present invention concerns a mechanical oscillator of the type comprising a mechanical resonator controlled by a driving coil coupled to at least one amplifier, the impedance of the coil being equivalent to an inductivity, a capacity and a resistance connected in parallel and representing the effect of the mechanical resonator, in series with an inductivity and a resistance representing the effect of the coil when the resonator is immobilized, an output of the amplifier being connected by at least one positive reaction loop comprising the driving coil, to an input of the amplifier.

It is well known to establish mechanical oscillators, comprising a mechanical resonator the motion of which is maintained by an amplifier.

Oscillators of this kind, which can be utilized as a time base, are shown in the FIGURES 1 to 5. The one illustrated in the FIGURES 1 to 3 comprises a tuning fork 1, provided with a pole piece 2, co-operating with a driving coil 3. As illustrated in FIGURE 2, the impedance as seen at the terminals of the coil 3 is equivalent to an inductivity 4, a capacity 5 and a resistance 6, connected in parallel, corresponding to the effect of the tuning fork 1, the whole being in series with a resistance 7 and an inductivity 8 corresponding to the effect of the coil 3, when the tuning fork 1 is immobilized. The oscillator is obtained by connecting the output of the quadripole 9, corresponding (FIGURE 3) to the resonator 1 and to the coil 3 (FIGURE 1) to the input of the amplifier 10, the output of the amplifier 10 being connected to the input of the quadripole 9. The resistance 7 and the inductivity 8 of the coil 3 have an adverse effect on the comportment of the oscillator. In fact, the resistance 7 tends to cause the oscillator to effect relaxation oscillations and the inductivity 8 of the coil 3, together with its own capacity which is not shown displace the frequency of the oscillator towards a value which is above the frequency proper of the resonator 1.

In order to avoid these defects, an intermediate tap has been provided on the coil 3, as shown in FIGURE 4, which divides it into a pick-up part 11 and a driving part 12. A capacity 13 has been connected between the end terminals of the coil 3 in order to eliminate the perturbating effect of the coil 3. The quadripole equivalent to the resonator 1 and its coil 3 is illustrated in FIGURE 5, which shows the inductivities 14, 17 and the resistances 15, 18 of the said two parts, taking into account the ratio $n_1/n_2$ of the number of turns $n_1$ of the part 11 to the number of turns $n_2$ of the part 12, the two inductivities being coupled in 16. As may be seen in FIGURE 5, the condenser 13 is replaced by two condensers 13' and 13'' the respective values of which depend on the ratio $n_1/n_2$. This condenser 13, however, has an adverse effect on the operation of the oscillator, as it causes a rotation of the phase of the quadripole so that the frequency of the oscillator is no longer exactly equal to the frequency proper of the resonator. In addition, this condenser, which, given its small dimensions, must be a ceramic condenser, i.e. a condenser with a high temperature coefficient, causes a variation of the frequency in function of the temperature. The phase displacement produced by this condenser causes still another adverse effect: the current pulses emitted by the amplifier no longer coincide exactly with the moments when the voltage induced in the coil is at a maximum, which results in a reduction of the efficiency. Finally, as it is not possible to eliminate entirely the perturbating effects produced by the elements 13 to 18, the starting conditions of the oscillator are not satisfactory.

The purpose of the invention is to eliminate these disadvantages. It concerns an oscillator of the type defined above and characterized in that at least one output of the amplifier is connected to at least one input of the amplifier by at least one counter-reaction loop comprising at least one compensating impedance, the whole being such as to compensate at least the resistance of the driving coil.

FIGURE 6 to 12 of the drawing illustrate, by way of examples, three embodiments and a variant of the oscillator, object of the invention.

Figure 6:
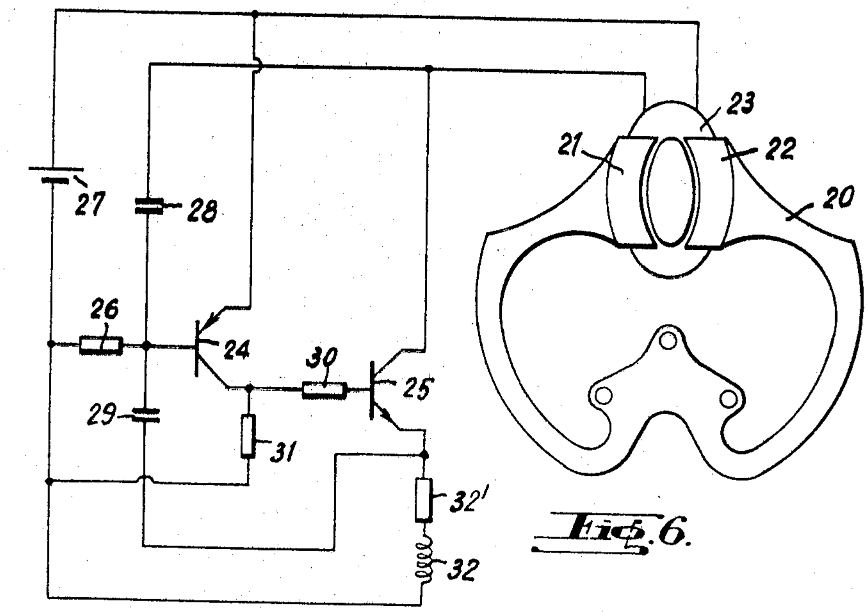
FIGURE 6 shows the diagram of the a first embodiment.

The first embodiment illustrated in FIGURE 6, comprises a resonator 20, provided with two pole pieces 21 and 22 cooperating with a driving coil 23. The resonator 20 which is shown schematically may be provided for instance with a ratchet mechanism, which is not shown, in order to drive the gearing of the hands of a watch. The amplifier is constituted by two silicon transistors 24 and 25 of the opposed type connected in cascade. The base of the first transistor 24 is connected, by a resistance 26, to a voltage source 27, by a capacity 28, to one of the terminals of the coil 23, and by a capacity 29, to the emitter of the transistor 25. The emitter of the transistor 24 is connected to the positive terminal of the voltage source 27, whilst its collector is connected, by a resistance 30, to the base of the transistor 25 and by a resistance 31, to the negative terminal of the voltage source 27. The point which is common to the emitter of the transistor 25 and to the capacity 29 is connected to the negative terminal of the source 27 by a compensating impedance constituted by a resistance 32' in series with an inductivity 32, the resistance 32' being for instance that of the self-inductance 32. The values of the components may be for example of 1.35 v. for the voltage source, 470 pf. for the capacity 28, of 22MΩ for the resistance 26, of 4.7MΩ for the resistance 31 and of 2.2MΩ for the resistance 30. The values of the capacity 29, of the resistance 32' and of the inductivity 32 may be equal to $N.C.$, $R/N$ and $L/N$, C being the value of the capacity 28, R the value of the resistance at rest of the coil 23 (illustrated in 7 of FIGURE 2), L is the value of the inductivity at rest of the coil 23 (illustrated in 8 in FIGURE 2), and N representing an arbitrary number, for instance 5.

Figure 7:
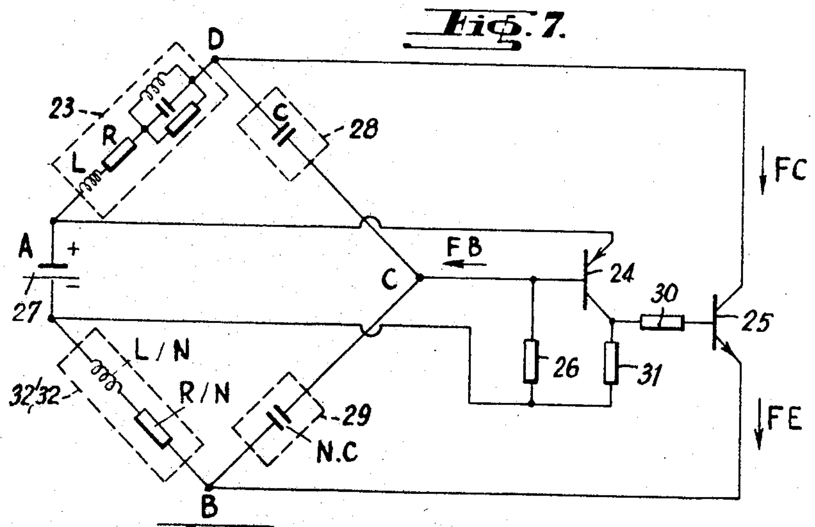
FIGURE 7 shows an explanatory diagram of this embodiment.

The operation of the oscillator is illustrated in FIGURE 7. It may be seen in this figure that the driving coil 23, the capacity 28, the capacity 29 and the compensating impedance 32', 32 constitute in effect the four branches of a bridge the summits of which are A, B, C and D. To a current pulse FB in the base of the transistor 24 corresponds a current pulse FC in the collector of the transistor 25 and a current pulse FE in the emitter of this same transistor, these two last pulses being sensibly identical. The oscillator will oscillate at a frequency which is such that the pulse FB is in phase with the pulses FC and FE, i.e. at a frequency such that the voltage difference $V_B-V_D$ between the summits B and D is in phase opposition with the voltage difference $V_C-V_A$ between the summits C and A. Calculating with complex impedances, the current $I_A$ in the two branches adjacent to the summit A is $$I_A=\frac{V_B-V_D}{j\omega L/N+R/N+j\omega L+R+\bar{Z}}$$

and the current $I_C$ in the two branches adjacent to the summit C is $$I_C=\frac{V_B-V_D}{1/j\omega NC+1/j\omega C}$$

Figure 1:
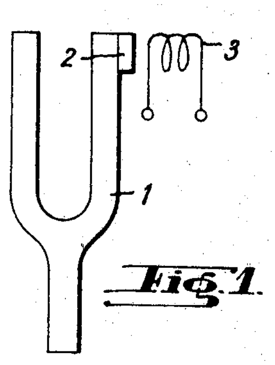
Figure 2:
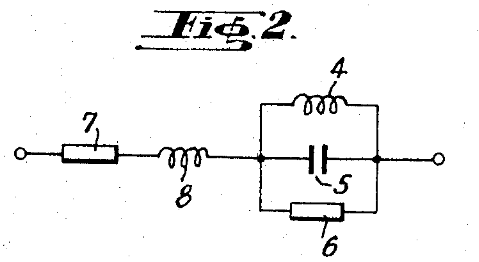
Figure 3:
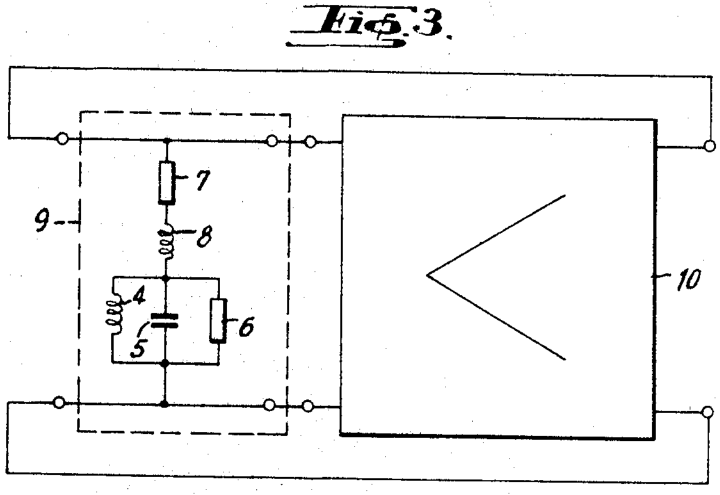
Figure 4:
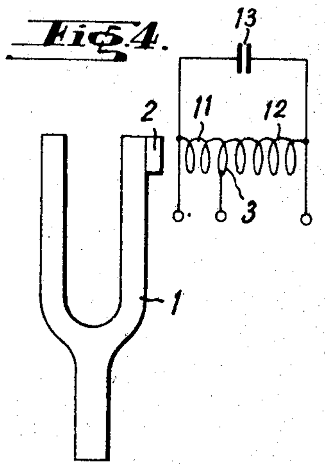
Figure 5:
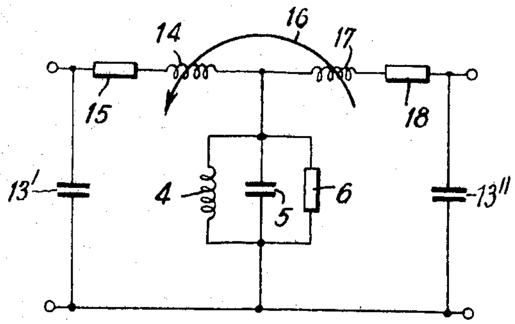

$\bar{Z}$ is designating the complex impedance corresponding to the resonator (i.e. to the elements 4, 5 and 6 in FIGURE 2).

The voltage difference between the summits B and A is $$V_B-V_A=\frac{j\omega L/N+R/N}{j\omega L/N+R/N+j\omega L+R+\bar{Z}}(V_B-V_D)$$

and that $V_B-V_C$ between the summits B and C $$V_B-V_C=\frac{1/j\omega NC}{1/j\omega NC+1/j\omega C}(V_B-V_D)$$

The voltage difference $V_C-V_A$ between the summits C and A is consequently $V_C-V_A=(V_B-V_A)-(V_B-V_C)$ which can be written $$V_C-V_A=-\frac{\bar{Z}}{[(1+1/N)(j\omega L+R)+\bar{Z}][1+N]}(V_B-V_D)$$

The voltage differences $V_C-V_A$ and $V_B-V_D$ will have opposite phases when $\bar{Z}$ becomes infinite, i.e. for the frequency proper of the resonator. There is no voltage difference $V_C-V_A$ when the resonator is at rest, i.e. when $\bar{Z}=0$. In this case, the bridge is balanced to avoid perturbating oscillations, which is the purpose of the circuit. It may be seen by this example that the two branches 23 and 28 together with the connection between the summit D and the collector of the transistor 25 constitute the positive reaction loop whilst the two other branches of the bridge and the connection between the summit B and the emitter of the transistor 25 constitute the counter-reaction loop containing the compensating impedance 32', 32.

The capacities 28 and 29 acting as voltage dividers could be replaced by other impedances; it must however be noted that the presence of a capacity is obligatory, this latter ensuring, together with the diode formed by the base-emitter junction of the transistor 24 and the resistance 26, the regulation of the duration of the pulses applied to the base of the transistor 24.

Figure 8:
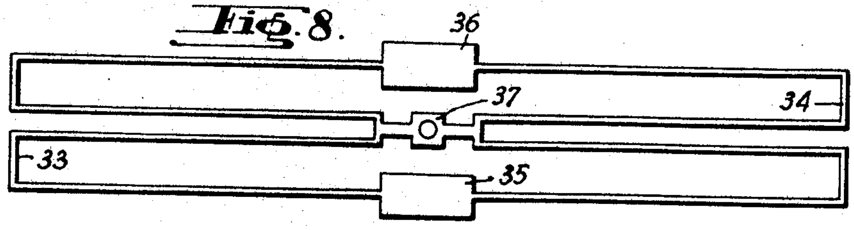
FIGURE 8 is a partial view of a variant of this first embodiment.

FIGURE 8 shows a variant of the resonator, which comprises two parts 33, 34 in the shape of an M and connected together by two pole pieces 35, 36 and a securing strip 37. This resonator offers the advantage of having a double symmetry.

Figure 9:
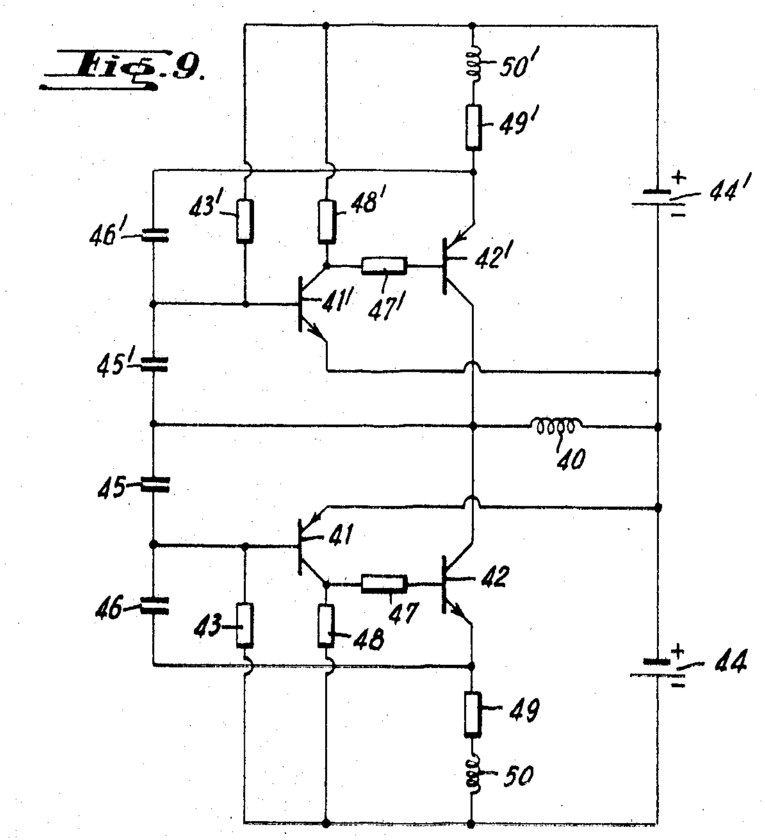
FIGURE 9 shows the diagram of a second embodiment.

FIGURE 9 shows a second embodiment the control circuit of which is, as a whole, constituted by two circuits similar to the preceding one, but of inverse polarity. One thus obtains a push-pull hook-up which offers the advantage of improved efficiency. The two parts of the circuit being symmetrical, only one of them will be described, the elements of the other part being affected with an index.

As the resonator may be the same as the one in the preceding embodiment, only its driving coil 40 has been schematically represented. The lower amplifier is constituted by two transistors 41 and 42 of opposite types and connected in cascade. The base of the first transistor 41 is connected, by a resistance 43, to the negative terminal of a voltage source 44, by a capacity 45, to one of the terminals of the coil 40 and by a capacity 46, to the emitter of the transistor 42. The emitter of the transistor 41 is connected to the positive terminal of the voltage source 44, whilst its collector is connected, by a resistance 47, to the base of the transistor 42, and by a resistance 48, to the negative terminal of the source 44. The point common to the emitter of the transistor 42 and to the capacity 46 is connected to the negative terminal of the source 44, by a compensating impedance constituted by a resistance 49 in series with an inductivity 50, where the resistance 49 may be that of the self-inductance 50.

Figure 10:
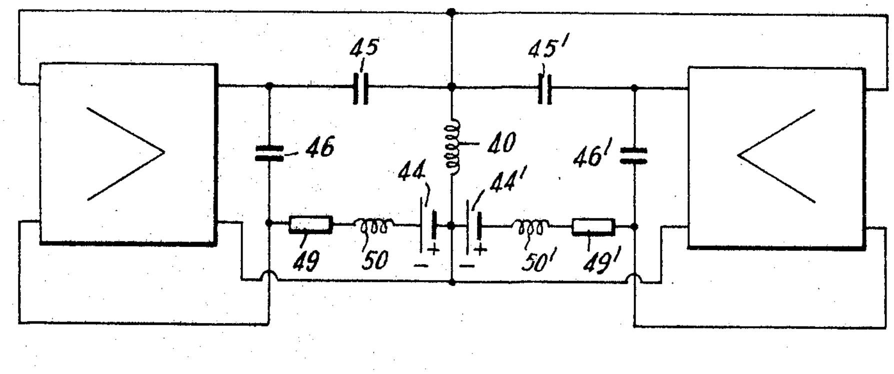
FIGURE 10 shows an explanatory diagram of the operation of this second embodiment.

The operation of this embodiment is immediately obvious from FIGURE 10 and from the explanations furnished in reference to FIGURE 7. As a matter of fact, as shown in FIGURE 10, each of the amplifiers may be made to correspond to a bridge such as the one shown in FIGURE 7, the two bridges having in common the branch constituted by the driving coil 40.

This embodiment offers the advantage of push-pull operation, but it requires two voltage sources.

Figure 11:
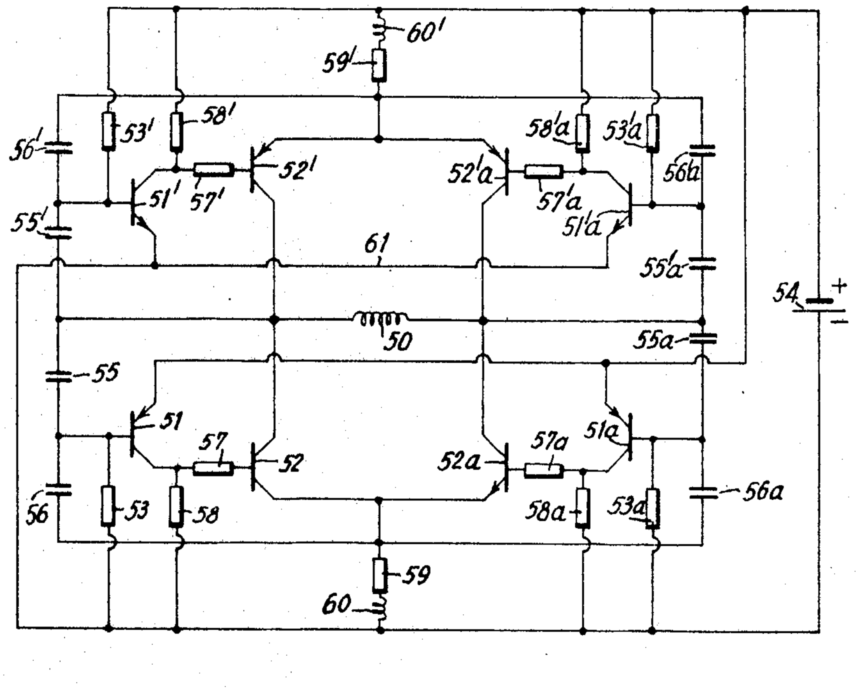
FIGURE 11 shows the diagram of still a third embodiment.

The third embodiment, shown in FIGURE 11, enables push-pull operation to be obtained with a single voltage source. This circuit comprises four amplifiers of which two are identical and of a polarity opposed to that of the two others, four voltage dividers each constituted by two condensers and two compensating impedances each constituted by a resistance and an inductivity. The circuit having a double symmetry only one amplifier and the associated elements will be described, the corresponding elements of the other elements being represented by the same reference cipher affected with an index.

As the resonator may be the same as in the preceding embodiments only its driving coil 50 has been schematically represented. The lower amplifier on the left is constituted by two transistors 51 and 52 of opposite types and connected in cascade. The base of the first transistor 51 is connected, by a resistance 53, to the negative terminal of a voltage source 54, by a capacity 55, to one of the terminals of the coil 50, and by a capacity 56, to the emitter of the transistor 52. The emitter of the transistor 51 is connected to the positive terminal of the voltage source 54, whilst its collector is connected, by a resistance 58, to the negative terminal of the source 54. The point common to the emitter of the transistor 52 and the capacity 56 is connected to the negative terminal of the source 54, by a compensating impedance constituted by a resistance 59 in series with an inductivity 60, in which the resistance 59 may be that of the self-inductance 60.

It may be seen that this circuit is constituted by two circuits such as that shown in FIGURE 9, the elements of the right-hand circuit being affected with the index *a*. Owing to the symmetrical arrangement, the emitters of the two transistors 41 and 41' (FIGURE 9) may be connected directly to the emitters of the corresponding transistors of the second circuit and the two terminals of the coil 40 may be connected between the points common to the collectors of the transistors 42 and 42' respectively to the corresponding collectors of the second circuit. The terminals common to the two sources 44 and 44' being thus devoid of any connection, it is obviously possible to provide a single source only, so that the diagram of FIGURE 11 is obtained.

Figure 12:
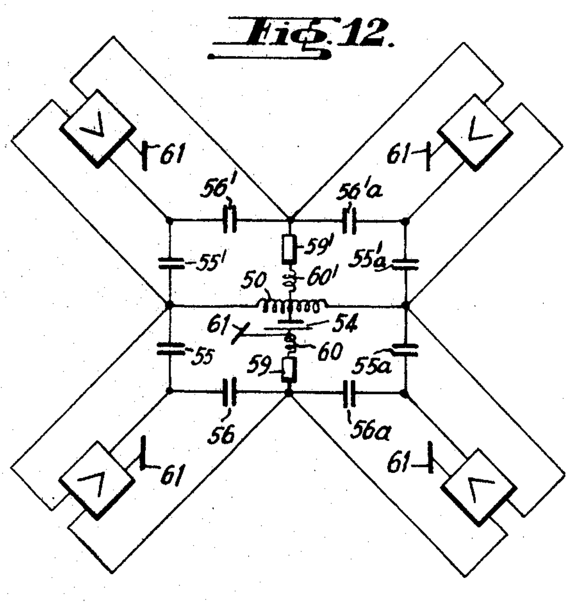
FIGURE 12 shows an explanatory diagram of the operation of this third embodiment.

The operation is illustrated in FIGURE 12. Owing to the symmetry existing between the left-hand side and the right-hand side, the middle point of the driving coil 50 may be considered to be connected to the connecting point between the two compensating impedances 59, 60 respectively 59', 60'. Owing to this, four bridges are constituted similar to the one shown in FIGURE 7. The lead 61 connects together all the inputs of the amplifiers which are not connected to the corresponding voltage divider, the alternating voltage of this lead being that of the electric middle point of the coil 50 and of the point common to the two compensating impedances 59, 60 and 59', 60'. Thus to each amplifier corresponds a reaction loop comprising the connection between one of the output terminals of the amplifier and one of the terminals of the driving coil, the corresponding half of this driving coil and the corresponding condenser 55, and a counter-reaction loop, comprising the connection between the other output terminal and one of the terminals of the compensating impedance, this impedance and the corresponding capacity 56.

In the embodiments described above, the amplifiers always contained two transistors. They could of course also contain three, four or more provided the phase between the input and the output is taken into account. The transistors can be connected as common emitter, common collector or common base. In integrated circuits, the transistor PNP with $\beta \simeq 1$ is especially easy to establish in connection with NPN transistors. Referring to FIGURE 6, such a circuit could comprise a first transistor of the PNP type, the base of which would be connected to the point common to the condensers 28 and 29, and, through a resistance 27, to the negative terminal of the source 27, the emitter to the positive terminal of this source and the collector to the base of a second transistor, of the NPN type, the base of which would, in addition, be connected to the said negative terminal by a resistance. The collector of this second transistor would be connected to the said positive terminal, and the emitter, through a resistance to the negative terminal, and, through another resistance, to the base of a third transistor, of the NPN type. As for the emitter and collector of this third transistor, they would be connected as for the transistor 25, in FIGURE 6.

What is claimed is:

1. An electromechanical oscillator comprising a mechanical resonator controlled by a driving coil, a compensating impedance connected in series with said driving coil by a voltage source, two capacitances connected in series, means connecting said driving coil and said compensating impedance and said two capacitances to form a bridge circuit, a first amplifier having output means, said output means including means to bridge the interconnection between said driving coil and one of said capacitances, said output means further including means to bridge the interconnection between said compensating impedance and the other of said capacitances, means connecting the other interconnections of said bridge to an input terminal of said first amplifier whereby the compensating impedance forms a negative feedback loop between said input terminal and said output means of said first amplifier to compensate for voltages induced by driving currents of said driving coil.

2. An oscillator as claimed in claim 1 wherein said first amplifier comprises two stages in order to change the phase of an amplified impulse.

3. An oscillator as claimed in claim 1 wherein said first amplifier comprises a collector branch and an emitter branch, said collector branch comprising said driving coil and said emitter branch comprising said compensating impedance.

4. An oscillator as claimed in claim 1 wherein the ratio between the impedance of said driving coil and said one of said capacitances and the impedance of said compensating impedance and said other of said capacitances is at least 5 to 1.

5. An oscillator as claimed in claim 1 wherein said bridge circuit comprises a first bridge circuit and a second bridge circuit having a bridge branch in common, said common bridge branch comprising said driving coil, means connecting said first amplifier to a second complementary equivalent amplifier, means connecting said second amplifier to said driving coil, said second amplifier including means to produce pulses opposite to the pulses of said first amplifier whereby both said first amplifier and said second amplifier work in push-pull operation with respect to said driving coil.

6. An oscillator as claimed in claim 5 including a third amplifier similar to said first amplifier, a fourth amplifier similar to said second amplifier, a first bridge circuit, a second bridge circuit, a third bridge circuit, said first bridge circuit including a bridge branch including a first compensating impedance connected to said third bridge circuit, said second bridge circuit including a bridge branch including a second compensating impedance connected to said fourth bridge circuit, means connecting output terminals of said first and second amplifiers to one terminal of said driving coil, means connecting output terminals of said third and fourth amplifiers to another terminal of said driving coil, and means connecting a voltage source between said first and said second compensating impedances so as to connect said two bridge branches including said compensating impedances in series.

References Cited

FOREIGN PATENTS 1,122,997 2/1962 Germany.

JOHN KOMINSKI, Primary Examiner

U.S. Cl. X.R.

58—23; 331—110